(12) United States Patent
Tamai

(10) Patent No.: US 7,974,796 B2
(45) Date of Patent: Jul. 5, 2011

(54) FULLY-CHARGED BATTERY CAPACITY DETECTION METHOD

(75) Inventor: Mikitaka Tamai, Sumoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 654 days.

(21) Appl. No.: 12/078,921

(22) Filed: Apr. 8, 2008

(65) Prior Publication Data

US 2008/0255783 A1    Oct. 16, 2008

(30) Foreign Application Priority Data

Apr. 10, 2007  (JP) .................................. 2007-103165

(51) Int. Cl.
*G01R 31/36*  (2006.01)
*H02J 7/00*  (2006.01)
(52) U.S. Cl. ........................................................ 702/63
(58) Field of Classification Search ...................... 702/63
See application file for complete search history.

(56) References Cited

U.S. PATENT DOCUMENTS

| | | | | |
|---|---|---|---|---|
| 5,872,453 | A * | 2/1999 | Shimoyama et al. | 324/431 |
| 7,456,612 | B2 * | 11/2008 | Murakami | 320/132 |
| 2002/0105303 | A1 | 8/2002 | Kishi et al. | |
| 2002/0195999 | A1 * | 12/2002 | Kimura et al. | 320/134 |
| 2004/0104706 | A1 * | 6/2004 | Ooi et al. | 320/132 |
| 2005/0237024 | A1 * | 10/2005 | Hogari et al. | 320/128 |
| 2008/0030169 | A1 * | 2/2008 | Kamishima et al. | 320/134 |
| 2008/0238371 | A1 * | 10/2008 | Tamezane | 320/134 |

FOREIGN PATENT DOCUMENTS

| | | |
|---|---|---|
| EP | 1 067 652 | 1/2001 |
| GB | 2 395 285 | 5/2004 |
| JP | 2002-236154 | 8/2002 |
| JP | 2006-292492 | 10/2006 |

OTHER PUBLICATIONS

United Kingdom Search Report issued Aug. 1, 2008 for Application No. GB0806297.8.

\* cited by examiner

*Primary Examiner* — Cindy Hien-Dieu Khuu
(74) *Attorney, Agent, or Firm* — Wenderoth, Lind & Ponack, L.L.P.

(57) ABSTRACT

A fully-charged battery capacity detection method detects first and second no-load voltages (VOCV1, VOCV2) of a battery at first no-load timing and second no-load timing, respectively. Further, first and second remaining capacities (SOC1 [%], SOC2 [%]) of the battery are determined based on the first and second no-load voltages, respectively, when the first no-load voltage (VOCV1) falls within a predetermined voltage range. Moreover, a fully-charged capacity (Ahf) of the battery is calculated based on a remaining capacity variation rate ($\delta$S [%]) and a capacity variation value ($\delta$Ah) of the battery. Also, the variation rate of the remaining capacity is calculated based on a difference between the first and second remaining capacities. The capacity variation value of the battery is calculated based on an integrated value of the charging current and discharge currents of the battery to be charged/discharged from the first no-load timing to the second no-load timing.

18 Claims, 7 Drawing Sheets

FULLY-CHARGED BATTERY CAPACITY DETECTION METHOD

BACKGROUND OF THE INVENTION

1. Field of the Invention

The present invention relates to a method that corrects and accurately detects a fully-charged battery capacity, which decreases with increasing the number of charging/discharging operation cycles.

2. Description of the Related Art

A capacity that can be charged to a fully-charged state (i.e., fully-charged capacity (Ahf) of a battery decreases with time and with increasing the number of charging/discharging operation cycles. The fully-charged capacity (Ahf) is expressed by the product of current (A) and time (h). The fully-charged capacity (Ahf) is the capacity of a battery that can be discharged from a fully-charged state to a fully-discharged state. As the battery that is fully charged is discharged, the product of current (A) and time (h) of the battery that can be discharged decreases. That is, the remaining capacity (Ahr) of the battery is getting smaller than the fully-charged capacity (Ahf. The remaining capacity (Ahr) relative to the fully-charged capacity (Ahf) is expressed as a remaining capacity (SOC [%]). The remaining capacity (SOC [%]) of the battery can be determined based on the no-load voltage (VOCV) of the battery. The reason is that the remaining capacity (SOC [%]) of the battery is detected by the no-load voltage. Since the remaining capacity (SOC [%]) is the remaining capacity (Ahr) relative to the fully-charged capacity (Ahf, even on the condition that the remaining capacity (SOC [%]) is the same value, the product of current (A) and time (h) of the battery that can be actually discharged varies. Since as the battery is repeatedly charged/discharged, the fully-charged capacity (Ahf) of the battery decreases, in order to accurately detect the remaining capacity (Ahr) of the battery, it is necessary to accurately detect the fully-charged capacity (Ahf of the battery, which decreases as the battery is repeatedly charged/discharged. The reason is that, if the fully-charged capacity (Ahf) of the battery decreases by half, even on the condition that the remaining capacity (SOC [%]) is the same value, the product of current (A) and time (h) of the battery that can be actually discharged decreases by half.

The fully-charged capacity (Ahf) of a battery can be detected by integrating charge capacity amounts that are charged to the battery in the fully-discharged state to the fully-charged state. The fully-charged capacity (Ahf) can be also detected by integrating discharge capacity amounts that are discharged from the battery in the fully-charged state to the fully-discharged state. However, batteries are unlikely to be used in the state where the batteries are fully charged from the fully-discharged state, or in the state where the batteries are fully discharged from the fully-charged state. In the most cases, batteries are charged before being fully discharged, and are not fully discharged from the fully-charged state. If a battery is not fully discharged, even when the battery is charged, the fully-charged capacity (Ahf) of the battery cannot be calculated. In order to detect the fully-charged capacity (Ahf) of this battery, it is necessary to fully discharge the battery prior to charging operation and then to fully charge the battery. In this method, the battery is required to be charged for a long time. In addition to this, this method cannot be used for a backup battery or the like that has less calculation chance.

As one method that solves these disadvantages, Japanese Patent Laid-Open Publication No. 2002-236154 discloses a method that detects the deterioration degree of a battery based on the accumulated charging capacity amount of the battery, and detects the reduction value of the fully-charged capacity (Ahf) of the battery. Also, this Publication discloses a method that detects the reduction rate of the fully-charged capacity of a battery based on the storage temperature and the remaining capacity of the battery as parameters.

SUMMARY OF THE INVENTION

The method in Japanese Patent Laid-Open Publication No. 2002-236154 can detect the fully-charged capacity without bringing the battery into the fully-charged state or the fully-discharged state. However, since this method estimates the reduction degree of the fully-charged capacity based on the accumulated charging capacity amount, or based on the storage temperature and the remaining capacity, it is difficult to constantly accurately detect the fully-charged capacity of the battery. The reason is that the deterioration of batteries complicatedly varies with various external conditions.

The present invention has been developed for solving the disadvantages. It is an important object of the present invention is to provide a method capable of accurately detecting the fully-charged capacity of a battery without bringing the battery into a fully-charged state or a fully-discharged state.

A fully-charged battery capacity detection method according to the present invention includes a no-load voltage detection step, a remaining capacity determination step, a remaining capacity variation rate calculation step, a capacity variation detection step, and a fully-charged capacity calculation step. In the no-load voltage detection step, first and second no-load voltages (VOCV1, VOCV2) of a battery are detected at first no-load timing and second no-load timing in that the battery is brought in a no-load state, respectively. In the remaining capacity determination step, it is determined whether the first no-load voltage (VOCV1) that is detected in the no-load voltage detection step falls within a predetermined voltage range, and first and second remaining capacities (SOC1 [%], SOC2 [%]) of the battery are determined based on the first and second no-load voltages (VOCV1, VOCV2), respectively, if the first no-load voltage (VOCV1) falls within the predetermined voltage range. In the remaining capacity variation rate calculation step, a remaining capacity variation rate ($\delta$S [%]) is calculated based on the difference between the first and second remaining capacities (SOC1 [%], SOC2 [%]) that are determined in the remaining capacity determination step. In the capacity variation detection step, a capacity variation value ($\delta$Ah) of the battery is calculated based on the integrated value of charging and discharging currents of the battery to be charged/discharged from the first no-load timing to the second no-load timing. In the fully-charged capacity calculation step, a fully-charged capacity (Ahf) of the battery is calculated based on the remaining capacity variation rate ($\delta$S [%]) and the capacity variation value ($\delta$Ah) by the following formula Ahf=$\delta$Ah/($\delta$S/100).

The aforementioned method has a feature in that the fully-charged capacity (Ahf) of a battery can accurately be detected without bringing the battery into a fully-charged state or a fully-discharged state. The reason is that the aforementioned method detects first and second no-load voltages (VOCV1, VOCV2) of a battery at first no-load timing and second no-load timing in that the battery is brought in a no-load state, respectively; determines whether the first no-load voltage (VOCV1) that is detected in the no-load voltage detection step falls within a predetermined voltage range, and determines first and second remaining capacities (SOC1 [%], SOC2 [%]) of the battery based on the first and second no-load voltages (VOCV1, VOCV2), respectively, if the first no-load voltage (VOCV1) falls within the predetermined voltage range; calculates a variation rate (δS [%]) of remaining capacity (SOC [%]) based on the difference between the first and second remaining capacities (SOC1 [%], SOC2 [%]); calculates a capacity variation value (δAh) of the battery based on the integrated value of charging and discharging currents of the battery to be charged/discharged from the first no-load timing to the second no-load timing; and accurately calculates an actual fully-charged capacity (Ahf) of the battery based on the variation rate (δS [%]) of remaining capacity (SOC [%]) and the capacity variation value (δAh).

In particular, since the aforementioned method determines whether the first no-load voltage (VOCV1) falls within a predetermined voltage range, and determines first and second remaining capacities (SOC1 [%], SOC2 [%]) of the battery based on the detected first and second no-load voltages (VOCV1, VOCV2) only in the case where the first no-load voltage (VOCV1) falls within the predetermined voltage range to detect the fully-charged capacity (Ahf) of the battery, the aforementioned method has a feature in that the remaining capacities (SOC [%]) are more accurately detected based on the no-load voltages (VOCV) so that the fully-charged capacity can be accurately detected.

In addition to this, since the method can accurately calculate the fully-charged capacity (Ahf) of the battery, it is also possible to accurately determine the deterioration degree of the battery based on the detected fully-charged capacity (Ahf.

In the fully-charged battery capacity detection method according to the present invention, it can be determined whether the capacity variation value (δAh) that is detected in the capacity variation detection step is larger than a predetermined value, and the fully-charged capacity (Ahf) of the battery can be calculated based on the remaining capacity variation rate (δS [%]) and the capacity variation value (δAh) in the fully-charged capacity calculation step if the capacity variation value (δAh) is larger than the predetermined value.

This fully-charged battery capacity detection method has a feature in that the fully-charged capacity of the battery can be accurately detected. The reason is that, since the capacity variation value (δAh) can be a certain value, the fully-charged capacity can be detected in the state where the error of measurement is small.

In the fully-charged battery capacity detection method according to the present invention, the first no-load timing can be timing in that a predetermined period elapses after the first no-load timing.

In this method, the fully-charged capacity of the battery can be accurately detected every charging operation in that the period elapses.

In the fully-charged battery capacity detection method according to the present invention, the first no-load timing can be timing in that the battery is brought in the no-load state before the battery is brought in charging operation, and the second no-load timing can be timing in that the battery is brought in the no-load state after the end of the charging operation.

In this fully-charged battery capacity detection method, the fully-charged capacity (Ahf) of the battery can be detected every battery charging operation.

In the fully-charged battery capacity detection method according to the present invention, the second no-load timing can be timing before the battery can be fully charged. In addition to this, in this fully-charged battery capacity detection method, in the remaining capacity determination step, it can be determined whether the second no-load voltage (VOCV2) that is detected in the no-load voltage detection step falls within a predetermined voltage range, and the second remaining capacity (SOC2 [%]) of the battery can be determined based on the second no-load voltage (VOCV2) if the second no-load voltage (VOCV2) falls within the predetermined voltage range.

This fully-charged battery capacity detection method has a feature in that the remaining capacities (SOC [%]) are more accurately detected based on the no-load voltages (VOCV) so that the fully-charged capacity can be accurately detected.

In the fully-charged battery capacity detection method according to the present invention, the battery can be a lithium-ion rechargeable battery or lithium-polymer battery. In the fully-charged battery capacity detection method according to the present invention, the battery can be a lithium-ion rechargeable battery that has a positive electrode that contains a three-compositional material.

In the case of the method in that the battery is a lithium-ion rechargeable battery or lithium-polymer battery, the voltage variation of such a battery in accordance with the remaining capacity (SOC [%]) is large. For this reason, the remaining capacity (SOC [%]) is accurately detected based on the no-load voltages (VOCV). Therefore, it is possible to accurately detect the fully-charged capacity (Ahf). In particular, in the method in that the battery is a lithium-ion rechargeable battery that has a positive electrode that contains a three-compositional material, the method has a feature in that the remaining capacity (SOC [%]) in accordance with the no-load voltage (VOCV) can be more accurately detected.

In the fully-charged capacity detection method according to the present invention, the first remaining capacity (SOC1 [%]) of the battery can be detected based on the first no-load voltage (VOCV1), and the second remaining capacity (SOC2 [%]) of the battery can be detected based on the second no-load voltage (VOCV2) by a stored function or table.

In this fully-charged capacity detection method, the remaining capacities (SOC [%]) are accurately detected based on the no-load voltages (VOCV). Therefore, it is possible to accurately detect the fully-charged capacity.

In this specification, the fully-charged capacity (Ahf, the remaining capacity (Ahr), and the remaining capacity (SOC [%]) are referred to as the following meanings.

The fully-charged capacity (Ahf) is referred to as the capacity of a battery that is discharged from a fully-charged state to a fully-discharged state, and is expressed by the product of current (A) and time (h).

The remaining capacity (Ahr) is referred to as the capacity that can be discharged until the battery is fully discharged and is expressed by the product of current (A) and time (h).

The remaining capacity (SOC [%]) is referred to as the ratio of the remaining capacity (Ahr) of the battery relative to the fully-charged capacity (Ahf of the battery.

The above and further objects of the present invention as well as the features thereof will become more apparent from the following detailed description to be made in conjunction with the accompanying drawings.

DETAILED DESCRIPTION OF THE PREFERRED EMBODIMENT(S)

Figure 1:
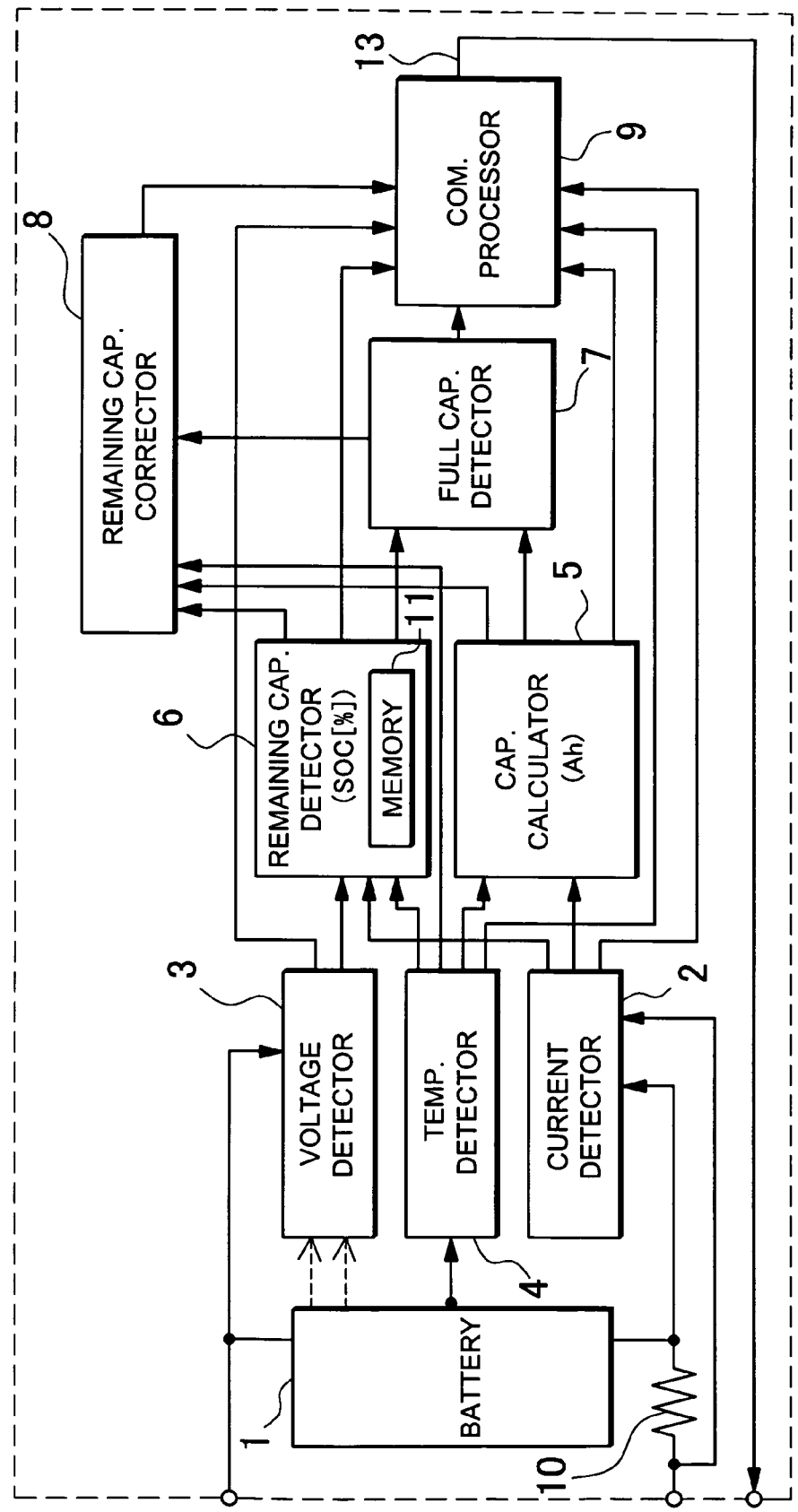
FIG. 1 is a circuit diagram of a battery pack that is used in a fully-charged battery capacity detection method according to one embodiment of the present invention.

FIG. 1 is a circuit diagram showing a circuit of a battery pack that detects the remaining capacity of the battery that supplies electric power to a mobile device. The battery pack includes a rechargeable battery 1, a current detection portion 2, a voltage detection portion 3, a temperature detection portion 4, a capacity calculation portion 5, a remaining capacity detection portion 6, a fully-charged capacity detection portion 7, a remaining capacity correction circuit 8, and a communication processing portion 9. The current detection portion 2 detects the charging/discharging currents of the battery 1. The voltage detection portion 3 (e.g., a voltage detection circuit) detects the voltage of the battery 1. The temperature detection portion 4 detects the temperature of the battery 1. The capacity calculation portion 5 calculates the output signals of the current detection portion 2 and integrates the charging/discharging currents of the battery 1 to detect the capacity (Ah) of the battery 1. The remaining capacity detection portion 6 determines the remaining capacity (SOC [%]) of the battery 1 based on the no-load voltage of the battery 1 that is detected by the voltage detection portion 3. The fully-charged capacity detection portion 7 detects the fully-charged capacity (Ahf) of the battery 1 based on the output signals of the remaining capacity detection portion 6 and the capacity calculation portion 5. The remaining capacity correction circuit 8 detects the remaining capacity (Ahr) of the battery based on the fully-charged capacity (Ahf) that is detected by the fully-charged capacity detection portion 7. The communication processing portion 9 sends battery information to the mobile device that uses the battery 1 as its power supply.

Figure 2:
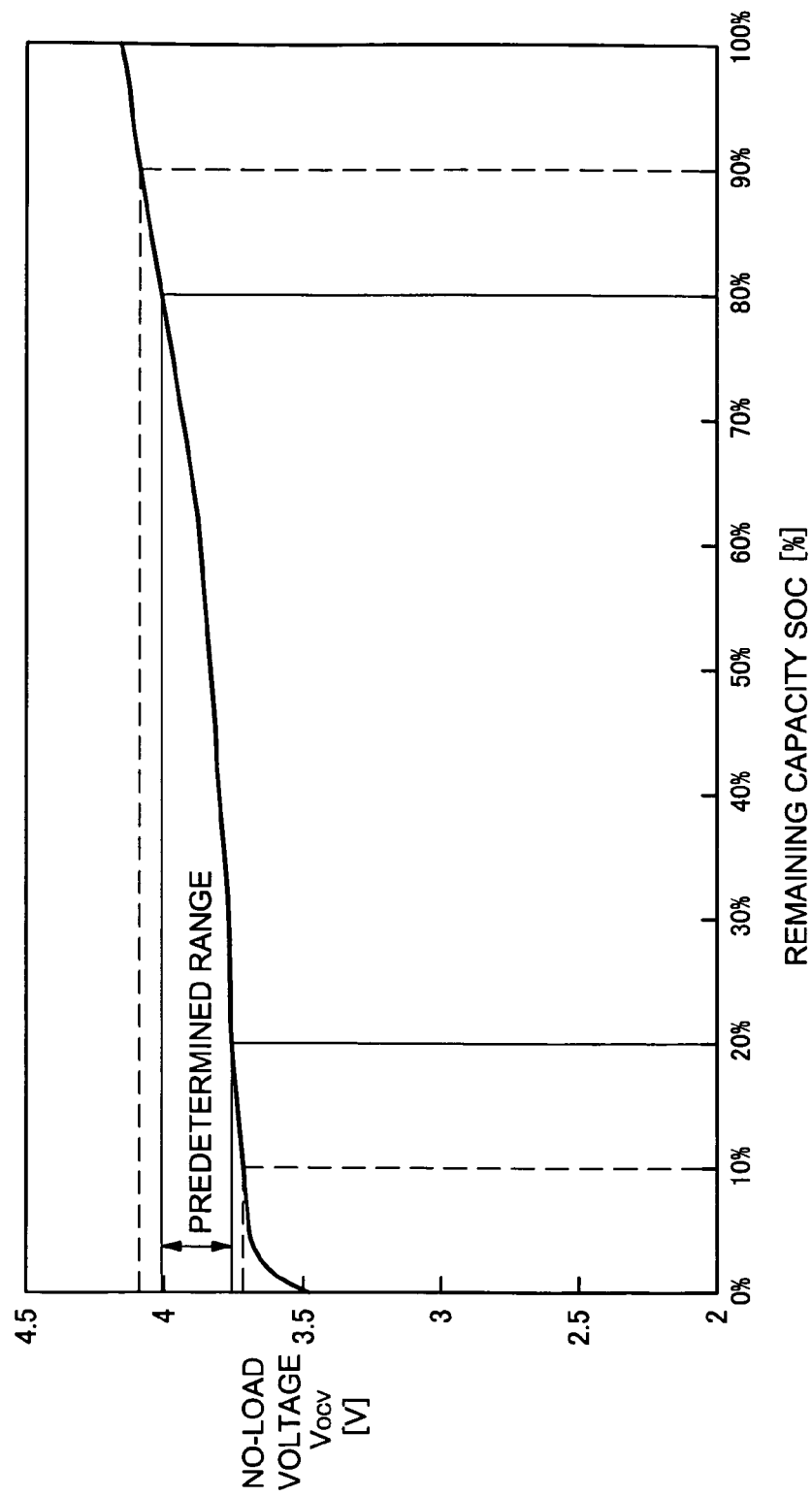
FIG. 2 is a graph showing the characteristic between remaining capacity and open-circuit voltage of a battery.

The battery 1 is a lithium-ion rechargeable battery that has a positive electrode that contains a three-compositional material. The lithium-ion rechargeable battery uses Li—Ni—Mn—Co composite oxide and lithium cobaltate mixture for the positive terminal of the battery instead of lithium cobaltate as a conventional material. Since this lithium-ion rechargeable battery uses Ni—Mn—Co of three compositional material in addition to lithium, the battery is highly stable in thermal characteristics even if charged at high voltage. The maximum charging voltage can be increased to 4.3 V, and the capacity of the battery can be increased. Since the fully-charged voltage of the battery can be increased, the variation of the no-load voltage of the battery in accordance with remaining capacity is large. Accordingly, the remaining capacity (SOC [%]) of the battery can be more accurately determined based on the no-load voltage. The battery 1 can be used that has a relationship between no-load voltage (VOCV) and remaining capacity (SOC [%]) that can be expressed by a substantially linear relationship, in particular, in a predetermined voltage range as shown in FIG. 2. However, the battery according to the present invention is not limited to a lithium-ion rechargeable battery that has a positive electrode that contains a three-compositional material. Batteries may be used that use one of lithium cobaltate, lithium nickelate and lithium manganate, or mixture of them at various ratios so that the batteries have a relationship between no-load voltage and remaining capacity (SOC [%]) that can be expressed by a substantially linear relationship as shown in FIG. 2. The battery can be any battery the remaining capacity (SOC [%]) of which varies in accordance with no-load voltage, for example, other lithium-ion rechargeable battery, lithium-polymer battery, nickel-hydrogen battery, nickel-cadmium battery, or the like. The battery 1 includes one battery section or a plurality of battery sections that are connected in series or in parallel.

The current detection portion 2 that detects the charging/discharging currents of the battery 1 detects a voltage that is generated between the both ends of the current detection resistor 10 that is connected to the battery 1 in series, and detects the charging current and the discharge current. The current detection portion 2 amplifies the voltage that is generated between the both ends of the current detection resistor 10 by means of an amplifier (not shown). The current detection portion 2 converts an analog signal of output signal of the amplifier into a digital signal by means of an A/D converter (not shown), and provides the digital signal. In the current detection resistor 10, a voltage is generated proportional to a current that flows in the battery 1. Accordingly, the current can be detected based on the voltage. The amplifier is an operational amplifier that can amplify +/− signals. Charging/discharge currents can be recognized based on the +/− signals of output voltage. The current detection portion 2 provides current signals of the battery 1 to the capacity calculation portion 5, the remaining capacity detection portion 6, and the communication processing portion 9.

The voltage detection portion 3 detects the voltage of the battery 1. The voltage detection portion 3 converts the detected analog signal into a digital signal by means of an A/D converter (not shown), and provides the digital signal. The voltage detection portion 3 provides the detected voltage signal of the battery 1 to the remaining capacity detection portion 6 and the communication processing portion 9. In the case of a battery pack that includes a plurality of battery cells in series, the respective voltages of the battery cells can be detected, and the average value of the voltages can be provided.

The temperature detection portion 4 detects the temperature of the battery 1. The temperature detection portion 4 converts the detected signal into a digital signal by means of an A/D converter (not shown), and provides the digital signal. The temperature detection portion 4 provides a temperature signal to the capacity calculation portion 5, the remaining capacity detection portion 6, the remaining capacity correction circuit 8, and the communication processing portion 9.

The capacity calculation portion 5 calculates the current signals of the digital signals that are provided from the current detection portion 2, and calculates the capacity (Ah) of the battery 1. The capacity calculation portion 5 subtracts a discharging capacity from a charging capacity of the battery 1, and calculates the capacity (Ah) of the battery 1 as an integrated current value (Ah). The charging capacity is calculated as the integrated value of charging currents of the battery 1, or is calculated by multiplying the integrated value by a charging efficiency value. The discharging capacity is calculated as the integrated value of discharging currents. The capacity calculation portion 5 corrects the integrated value of the charging capacity and the discharging capacity based on the signals that are provided from the temperature detection portion 4, and can accurately calculate the capacity. Alternatively, instead of integration of digital signals, an amplifier portion may integrate analog signals.

The remaining capacity detection portion 6 determines the remaining capacity (SOC [%]) of the battery 1 based on the no-load voltage (VOCV) of the battery 1 that is detected by the voltage detection portion 3. For this reason, the remaining capacity detection portion 6 stores remaining capacity (SOC [%]) in accordance with no-load voltage (VOCV) of the battery 1 as a function or table in a memory 11. FIG. 2 is a graph showing the remaining capacity (SOC [%]) against the no-load voltage (VOCV) of the battery. The memory 11 stores the characteristic between the no-load voltage and the remaining capacity shown in the graph as the function or table. The remaining capacity detection portion 6 determines the remaining capacity (SOC [%]) in accordance with the no-load voltage (VOCV) based on the function or table that is stored in the memory 11.

The remaining capacity detection portion 6 detects the no-load voltage (VOCV) of the battery 1 based on the voltage signal of the battery 1 that is provided from the voltage detection portion 3, and the current signal that is provided from the current detection portion 2. The remaining capacity detection portion 6 detects the voltage value that is provided from the voltage detection portion 3 as the no-load voltage (VOCV) in a no-load state where a charging/discharging current value that is provided from the current detection portion 2 becomes 0. The remaining capacity detection portion 6 detects the first and second no-load voltages (VOCV1, VOCV2) of the battery 1 at first no-load timing and second no-load timing in that the battery 1 is brought in the no-load state. The remaining capacity detection portion 6 determines whether the detected first no-load voltage (VOCV1) falls within a predetermined voltage range, and determines first and second remaining capacities (SOC1 [%], SOC2 [%]) of the battery based on the first and second no-load voltages (VOCV1, VOCV2), respectively, if the first no-load voltage (VOCV1) falls within the predetermined voltage range. The reason to determine whether the first no-load voltage (VOCV1) falls within the predetermined voltage range is to sufficiently accurately determine the remaining capacity (SOC1 [%]) of the battery 1 based on the detected first no-load voltage (VOCV1). For example, the remaining capacity detection portion 6 determines whether the first no-load voltage (VOCV1) falls within a predetermined range that corresponds to a range of 10% to 90%, preferably 20% to 80%, in the remaining capacity (SOC [%]) of the battery 1 as shown in FIG. 2. Since it is determined whether the first no-load voltage (VOCV1) falls within the predetermined voltage range, and then the first remaining capacity (SOC1 [%]) is determined if the first no-load voltage (VOCV1) falls within the predetermined voltage range, the remaining capacity (SOC [%]) is more accurately determined, and the fully-charged capacity (Ahf can be more accurately determined.

In addition to this, the second no-load timing is timing before the battery is fully charged. The remaining capacity detection portion 6 can determine whether the detected second no-load voltage (VOCV2) falls within a predetermined voltage range, and can determine the second remaining capacity (SOC2 [%]) of the battery based on the second no-load voltage (VOCV2) if the second no-load voltage (VOCV2) falls within the predetermined voltage range. The remaining capacity detection portion 6 also determines whether the second no-load voltage (VOCV2) falls within the predetermined range that corresponds to a range of 10% to 90%, preferably 20% to 80%, in the remaining capacity (SOC [%]) of the battery, and determines the second remaining capacity (SOC2 [%]) based on the second no-load voltage (VOCV2) if the second no-load voltage (VOCV2) falls within the predetermined range.

The fully-charged capacity detection portion 7 detects the fully-charged capacity (Ahf) of the battery 1 based on the variation of the remaining capacity (SOC [%]) of the battery 1 that is detected by the remaining capacity detection portion 6 (i.e., the variation rate ($\delta S$ [%]) of the remaining capacity (SOC [%]), and the variation of the capacity (Ah) of the battery 1 that is detected by the capacity calculation portion 5 (i.e., the capacity variation value ($\delta Ah$)) by the following formula. $Ahf = \delta Ah/(\delta S/100)$.

The remaining capacity (Ahr) and the remaining capacity (SOC [%]) of the battery 1 vary when the battery 1 is charged/discharged. The remaining capacity (Ahr) and the remaining capacity (SOC [%]) of the battery decrease when the battery is discharged. The remaining capacity (Ahr) and the remaining capacity (SOC [%]) of the battery increase when the battery is charged. The capacity (Ah) of the battery that varies is detected by the capacity calculation portion 5. The capacity calculation portion 5 integrates the charging and discharge currents of the battery 1, and calculates the capacity (Ah). The remaining capacity (SOC [%]) of the battery that varies is detected by the remaining capacity detection portion 6. The remaining capacity detection portion 6 determines the remaining capacity (SOC [%]) based on the voltage of the battery 1.

The capacity calculation portion 5 detects the capacity (Ah) of the battery that varies. The remaining capacity detection portion 6 detects the remaining capacity (SOC [%]) of the battery that varies. The fully-charged capacity detection portion 7 calculates the fully-charged capacity (Ahf) based on the capacity variation value ($\delta Ah$) of the battery that varies and the variation rate ($\delta S$ [%]) of the remaining capacity. In order to detect the capacity variation value ($\delta Ah$) of the battery 1 and the variation rate ($\delta S$ [%]) of the remaining capacity, the fully-charged capacity detection portion 7 calculates the remaining capacity variation value ($\delta Ah$) and the variation rate $6S$ [%]) of the battery 1 to be charged/discharged between the first no-load timing and the second no-load timing.

Figure 3:
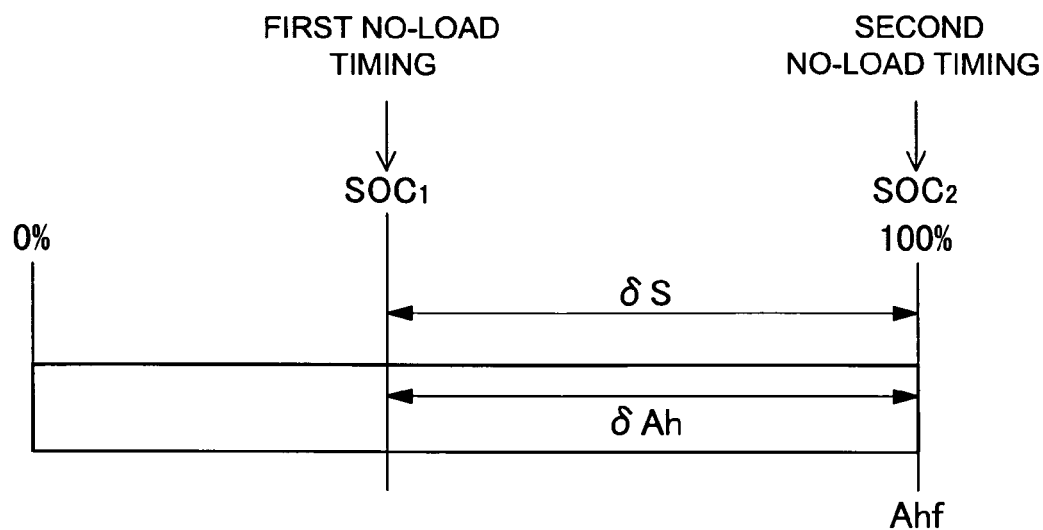
FIG. 3 is a view schematically showing the fully-charged battery capacity detection method according to the embodiment of the present invention.
Figure 3:
Figure 3:
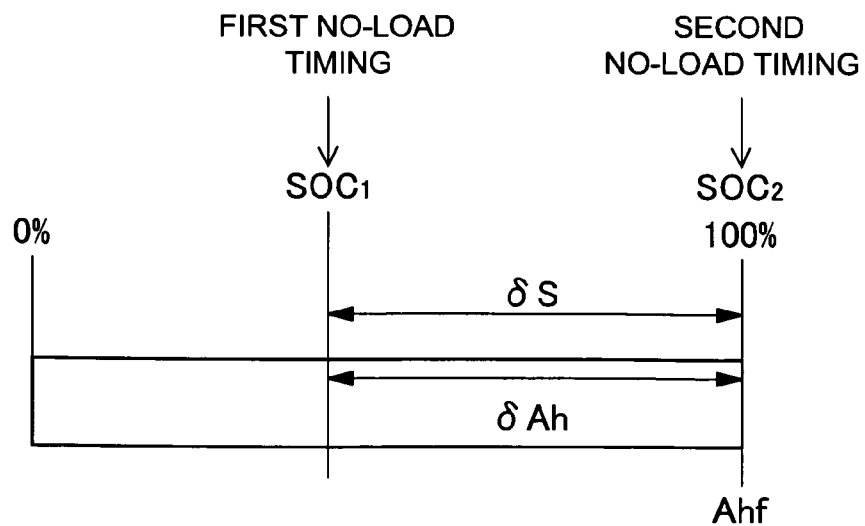
Figure 5:
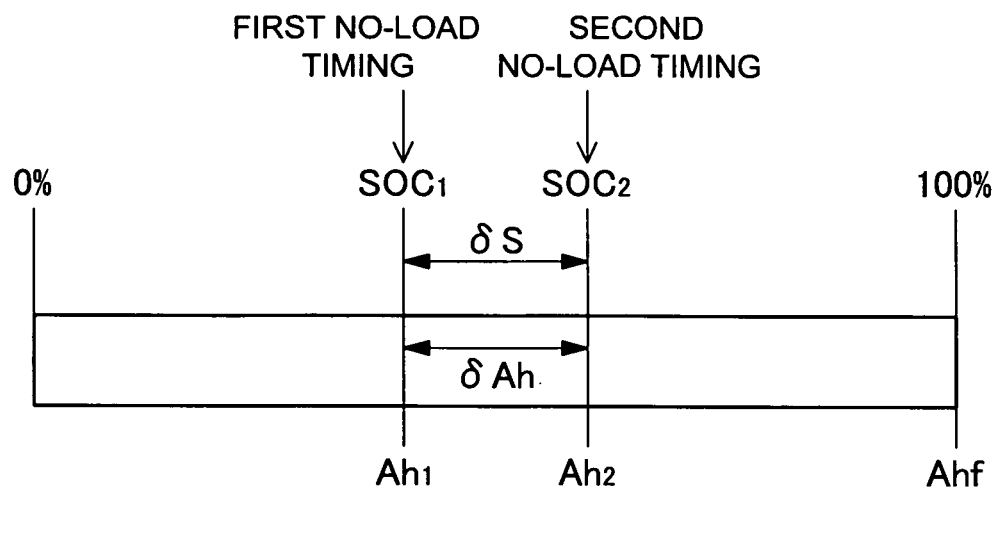
FIG. 5 is a view schematically showing a fully-charged battery capacity detection method according to another embodiment of the present invention.
Figure 5:
Figure 5:
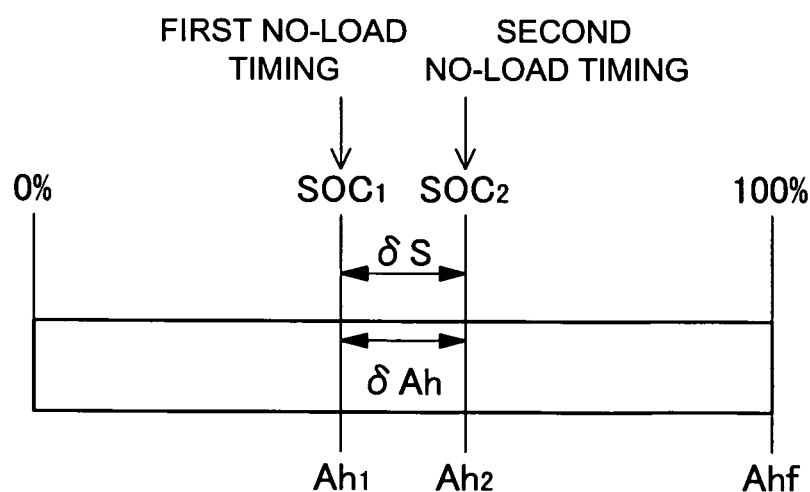

The fully-charged capacity detection portion 7 calculates the capacity variation value ($\delta Ah$) based on the integrated value of the charging/discharging currents from the first no-load timing to the no-load detection timing as shown in FIG. 3. Alternatively, as shown in FIG. 5, the fully-charged capacity detection portion 7 calculates the capacity variation value ($\delta Ah$) based on the difference between first and second capacities (Ah1, Ah2) of the battery that are detected at the first no-load timing and the second no-load timing, respectively. Also, the fully-charged capacity detection portion 7 calculates the variation rate ($\delta S$ [%]) of the remaining capacity based on the difference between the remaining capacity (SOC1 [%]) that is detected at the first no-load timing and the remaining capacity (SOC2 [%]) that is detected at the second no-load timing.

In FIGS. 3 and 5, the upper part shows fully-charged capacity (Ahf) detection of a battery the fully-charged capacity (Ahf) of which is high (i.e., in an initial state where the battery does not deteriorate), and the lower part shows fully-charged capacity (Ahf) detection of the battery the fully-charged capacity (Ahf) of which decreases caused by deterioration.

As for the first no-load timing and the second no-load timing, the first no-load timing is timing in the no-load state before the battery 1 is charged, and the second no-load timing is timing in the no-load state after the end of the charging operation. For example, the first no-load timing can be a point in the no-load state from when the battery 1 is set to be charged until the battery 1 charging operation starts. The second no-load timing can be a point after the battery 1 charging operation ends and after the battery voltage becomes stable, for example, timing in that 15 minutes elapses after the ends of the battery 1 charging operation. In this case, the remaining capacity (SOC [%]) can be more accurately detected based on the detection at the no-load timing. However, the second no-load timing can be timing in that a period of five minutes to one hour elapses after the ends of the battery 1 charging operation.

However, the first no-load timing and the second no-load timing may be set so that the interval between the first no-load timing and the second no-load timing is constant. For example, the second no-load timing may be timing in that a period of a few minutes to a few hours elapses after the first no-load timing and in that the battery 1 is brought in the no-load state. Also, the second no-load timing may be timing in that the battery 1 is brought into the no-load state after the capacity variation value ($\delta$Ah) becomes larger a predetermined value, e.g., 10% of the rated capacity of the battery after the first no-load timing.

The remaining capacity correction circuit 8 calculates the remaining capacity (Ahr) based on the fully-charged capacity (Ahf) of the battery 1 that is detected by the fully-charged capacity detection portion 7, and the remaining capacity (SOC [%]) of the battery 1 that is detected based on the no-load voltage (VOCV). That is, the remaining capacity correction circuit 8 calculates the remaining capacity (Ahr) based on the fully-charged capacity (Ahf) of the battery 1 that is detected by the fully-charged capacity detection portion 7, and the remaining capacity (SOC [%]) that is detected based on the no-load voltage (VOCV) by the following formula:

Remaining Capacity (*Ahr*)=Fully-Charged Capacity (*Ahf*)×Remaining Capacity (*SOC* [%]).

For example, the remaining capacity (SOC [%]) that is detected based on the no-load voltage (VOCV) can be the second remaining capacity (SOC2 [%]) that is detected at the second no-load timing. In the case where the remaining capacity (SOC2 [%]) of the battery 1 is 100 [%], in other words, in the case where the battery 1 is fully charged, the calculated fully-charged capacity (Ahf) is the remaining capacity (Ahr) of the battery 1 at the point in time when the fully-charged capacity (Ahf) is calculated.

However, the remaining capacity correction circuit 8 may calculate the remaining capacity (Ahr) in a manner different from the aforementioned manner. For example, the remaining capacity correction circuit 8 can calculate the remaining capacity (SOC [%]) of the battery 1 based on the fully-charged capacity (Ahf) of the battery 1 that is detected by the fully-charged capacity detection portion 7 in consideration of other parameters such as battery temperature.

The communication processing portion 9 sends battery information through a communication line 13 to the mobile device that includes the battery pack. The battery information includes the remaining capacity (Ahr) that is calculated by the remaining capacity correction circuit 8, the fully-charged capacity (Ahf) that is detected by the fully-charged capacity detection portion 7, the remaining capacity (SOC [%]) that is detected by the remaining capacity detection portion 6, the battery voltage that is detected by the voltage detection portion 3, the current value that is detected by the current detection portion 2, the temperature that is detected by the temperature detection portion 4, and the like.

The battery pack can determine the deterioration degree of the battery 1 based on the calculated fully-charged capacity (Ahf. In this case, the battery pack determines the deterioration degree of the battery 1 based on the reduction degree of the calculated fully-charged capacity (Ahf relative to the rated capacity (Ahs) of the battery. The battery pack stores a function or table to detect the deterioration degree of the battery based on the fully-charged capacity (Ahf) or the ratio of the fully-charged capacity relative to the rated capacity (Ahf/Ahs) of the battery. The battery pack detects the deterioration degree of the battery based on the stored function or table.

The aforementioned battery pack detects the fully-charged capacity of the battery by using the following steps.
(No-Load Voltage Detection Step)

The first and second no-load voltages (VOCV1, VOCV2) of the battery are detected at the first no-load timing and second no-load timing in that the battery is brought in the no-load state, respectively.
(Remaining Capacity Determination Step)

It is determined whether the first no-load voltage (VOCV1) that is detected in the no-load voltage detection step falls within the predetermined voltage range, and the first and second remaining capacities (SOC1 [%], SOC2 [%]) of the battery are determined based on the first and second no-load voltages (VOCV1, VOCV2), respectively, if the first no-load voltage (VOCV1) falls within the predetermined voltage range.
(Remaining Capacity Variation Rate Calculation Step)

The remaining capacity variation rate ($\delta$S [%]) is calculated based on the difference between the first and second remaining capacities (SOC1 [%], SOC2 [%]) that are determined in the remaining capacity determination step.
(Capacity Variation Detection Step)

The capacity variation value ($\delta$Ah) of the battery is calculated based on the integrated value of charging and discharging currents of the battery to be charged/discharged from the first no-load timing to the second no-load timing.
(Fully-Charged Capacity Calculation Step)

The fully-charged capacity (Ahf) of the battery is calculated based on the remaining capacity variation rate ($\delta$S [%]) and the capacity variation value ($\delta$Ah) by the following formula $Ahf=\delta Ah/(\delta S/100)$.

Figure 4:
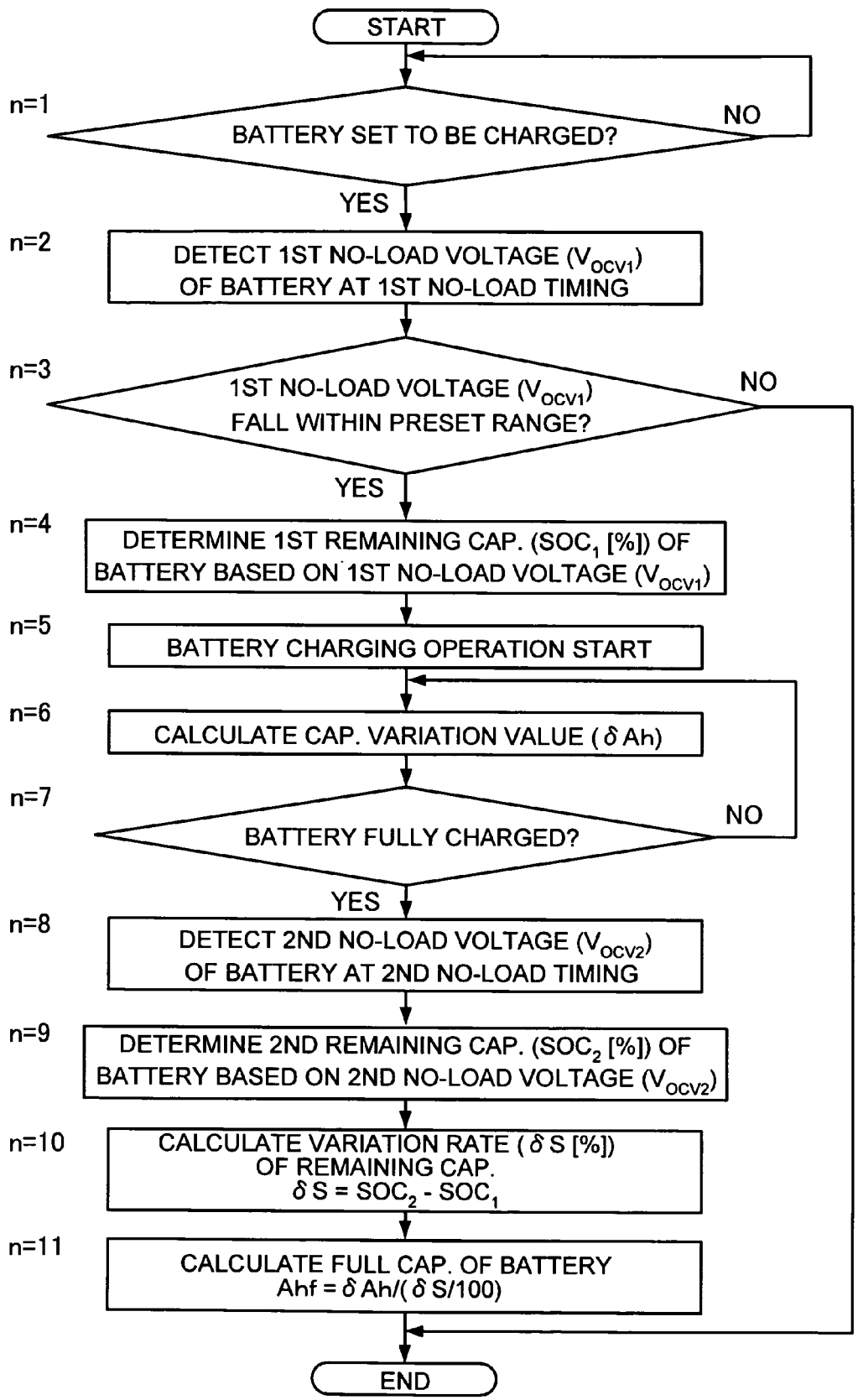
FIG. 4 is a flowchart showing the fully-charged battery capacity detection method according to the embodiment of the present invention.

With reference to FIG. 4, the aforementioned battery pack detects the fully-charged capacity of the battery by using the following steps.
(Step n=1)

It is determined whether the battery 1 is set to be charged. This step is repeatedly executed until the battery 1 is set to be charged.
(Step n=2)

If the battery 1 is set to be charged, the battery 1 is brought into the no-load state before battery 1 charging operation starts. The first no-load timing is the timing in that the battery 1 is brought in the no-load state before battery 1 charging operation starts. At this first no-load timing, the first no-load voltage (VOCV1) of the battery 1 is detected.
(Steps n=3 to 5)

The remaining capacity detection portion 6 determines whether the detected first no-load voltage (VOCV1) falls within the predetermined range. If the first no-load voltage (VOCV1) falls outside the predetermined range, it is determined that the remaining capacity (SOC [%]) of the battery 1 in a charging operation initial stage falls outside the predetermined range, and the calculation of the fully-charged capacity stops. If the first no-load voltage (VOCV1) falls within the predetermined range, the first remaining capacity (SOC1 [%]) of the battery 1 is determined based on the detected first no-load voltage (VOCV1) by using the function or table. Then, battery 1 charging operation starts.
(Steps n=6 and 7)

In the state where the battery 1 is charged, the capacity calculation portion 5 integrates the charging/discharging currents of the battery 1, and calculates the capacity variation value (δAh). In this step, the capacity variation value (δAh) is calculated until the battery 1 is fully charged. In the case of a lithium ion battery, after the battery is charged at constant current, the battery is charged at constant voltage, and it is determined that the battery is fully charged when a charging current reaches a predetermined value or less as in a well-known manner.
(Step n=8)

The battery 1 is brought into the no-load state if the battery 1 is fully charged. The second no-load timing is the timing in that the battery 1 is brought in the no-load state after the battery 1 is fully charged. At the second no-load timing, the second no-load voltage (VOCV2) is detected.
(Step n=9)

The remaining capacity detection portion 6 determines the remaining capacity (SOC2 [%]) of the battery 1 based on the detected second no-load voltage (VOCV2) by using the function or table. In this point in time, since the battery 1 is fully charged, the remaining capacity (SOC2 [%]) of the battery 1 is 100 [%].
(Step n=10)

The fully-charged capacity detection portion 7 calculates the remaining capacity variation rate (δS [%]) based on the difference between the first and second remaining capacities (SOC1 [%], SOC2 [%]) of the battery 1.
(Step n=11)

The fully-charged capacity detection portion 7 calculates the fully-charged capacity (Ahf) of the battery 1 based on the calculated capacity variation value (δAh) and the calculated variation rate (δS [%]) of the remaining capacity by the following formula Ahf=δAh/(δS/100).

In the aforementioned method, since the first no-load timing is timing before the battery is charged, and the second no-load timing is timing after the battery is fully charged, as shown in FIG. 3, it is possible to detect the corrected fully-charged battery capacity (Ahf) every when the battery is fully charged. However, in the fully-charged battery capacity detection method according to the present invention, the battery is not always required to be fully charged. The second no-load timing can be timing before the battery is fully charged as shown in the schematic diagram of FIG. 5, and the fully-charged capacity of the battery can be calculated at this second no-load timing. In this method, the second no-load timing is timing in that the battery is brought in the no-load state again after a predetermined period elapses or the capacity variation value (δAh) reaches a predetermined capacity after the no-load state of the battery is detected and the first no-load timing is provided, and the fully-charged capacity (Ahf) of the battery is calculated at this second no-load timing.

Figure 6:
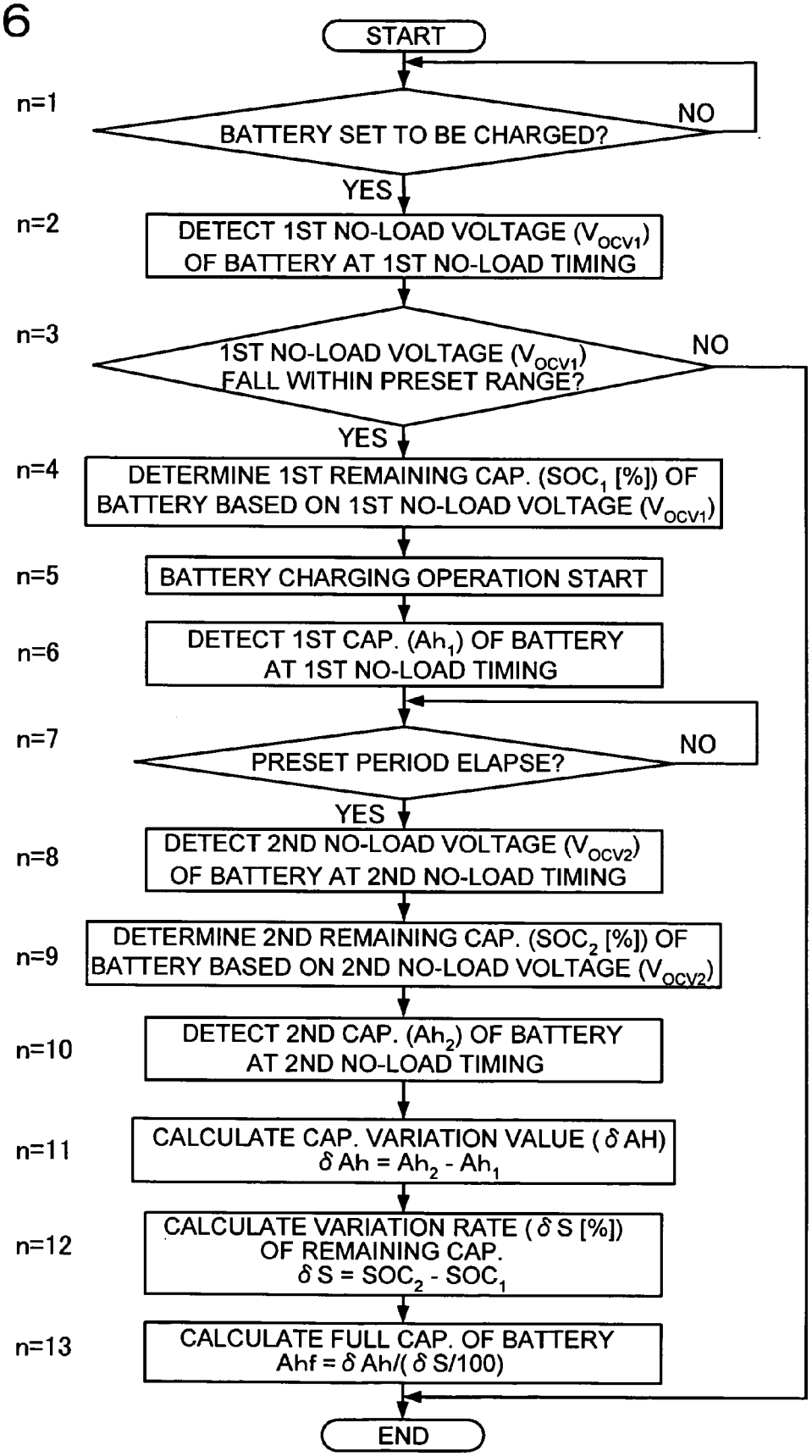
FIG. 6 is a flowchart showing the fully-charged battery capacity detection method according to the embodiment of the present invention.

FIG. 6 is a flow chart showing a method for detecting the fully-charged capacity of the battery 1 in that the second no-load timing is timing after a predetermined period elapses from the first no-load timing. In this method, the fully-charged capacity of the battery 1 is detected before the battery is fully charged.
(Step n=1)

It is determined whether the battery 1 is set to be charged. This step is repeatedly executed until the battery 1 is set to be charged.

(Step n=2)

If the battery 1 is set to be charged, the battery 1 is brought into the no-load state before battery 1 charging operation starts. The first no-load timing is the timing in that the battery 1 is brought in the no-load state before battery 1 charging operation starts. At this first no-load timing, the first no-load voltage (VOCV1) of the battery 1 is detected.
(Steps n=3 to 5)

The remaining capacity detection portion 6 determines whether the detected first no-load voltage (VOCV1) falls within the predetermined range. If the first no-load voltage (VOCV1) falls outside the predetermined range, it is determined that the remaining capacity (SOC [%]) of the battery 1 in a charging operation initial stage falls outside the predetermined range, and the calculation of the fully-charged capacity stops. If the first no-load voltage (VOCV1) falls within the predetermined range, the first remaining capacity (SOC1 [%]) of the battery 1 is determined based on the detected first no-load voltage (VOCV1) by using the function or table. Then, battery 1 charging operation starts.
(Step n=6)

The fully-charged capacity detection portion 7 detects the first capacity (Ah1) of the battery 1 at the first no-load timing. For example, the fully-charged capacity detection portion 7 multiplies the fully-charged capacity (Ahf) of the battery 1 that is detected at the latest detection timing by the first remaining capacity (SOC1 [%]) of the battery 1 that is determined in Step n=4, and thus can calculate and detect the first capacity (Ah1) of the battery 1.
(Step n=7)

It is determined whether the predetermined period elapses from the first no-load timing. This step is repeatedly executed until the predetermined period elapses.
(Step n=8)

If the predetermined period elapses from the first no-load timing, a current that flows into the battery 1 is cut off, and the battery 1 is brought into the no-load state. The second timing is the timing in that after the predetermined period elapses from the first no-load timing the battery 1 is brought in the no-load state. The second no-load voltage (VOCV2) of the battery 1 is detected at this second no-load timing.
(Step n=9)

The remaining capacity detection portion 6 determines the remaining capacity (SOC2 [%]) of the battery 1 based on the detected second no-load voltage (VOCV2) by using the function or table.
(Step n=10)

The fully-charged capacity detection portion 7 detects the second capacity (Ah2) of the battery 1 at the second no-load timing. The second capacity (Ah2) of the battery 1 is calculated by the capacity calculation portion 5 based on the integrated value of the charging and discharge currents of the battery 1 to be charged/discharged.
(Step n=11)

The fully-charged capacity detection portion 7 calculates the capacity variation value (δAh) based on the difference between the first capacity (Ah1) of the battery 1 at the first no-load timing and the second capacity (Ah2) of the battery 1 at the second no-load timing as shown in FIG. 5
(Step n=12)

The fully-charged capacity detection portion 7 calculates the remaining capacity variation rate (δS [%]) based on the difference between the first and second remaining capacities (SOC1 [%], SOC2 [%]) of the battery 1 as shown in FIG. 5.
(Step n=13)

The fully-charged capacity detection portion 7 calculates the fully-charged capacity (Ahf) of the battery 1 based on the calculated capacity variation value (δAh) and the calculated variation rate (δS [%]) of the remaining capacity by the following formula $$Ahf = \delta Ah/(\delta S/100).$$

Figure 7:
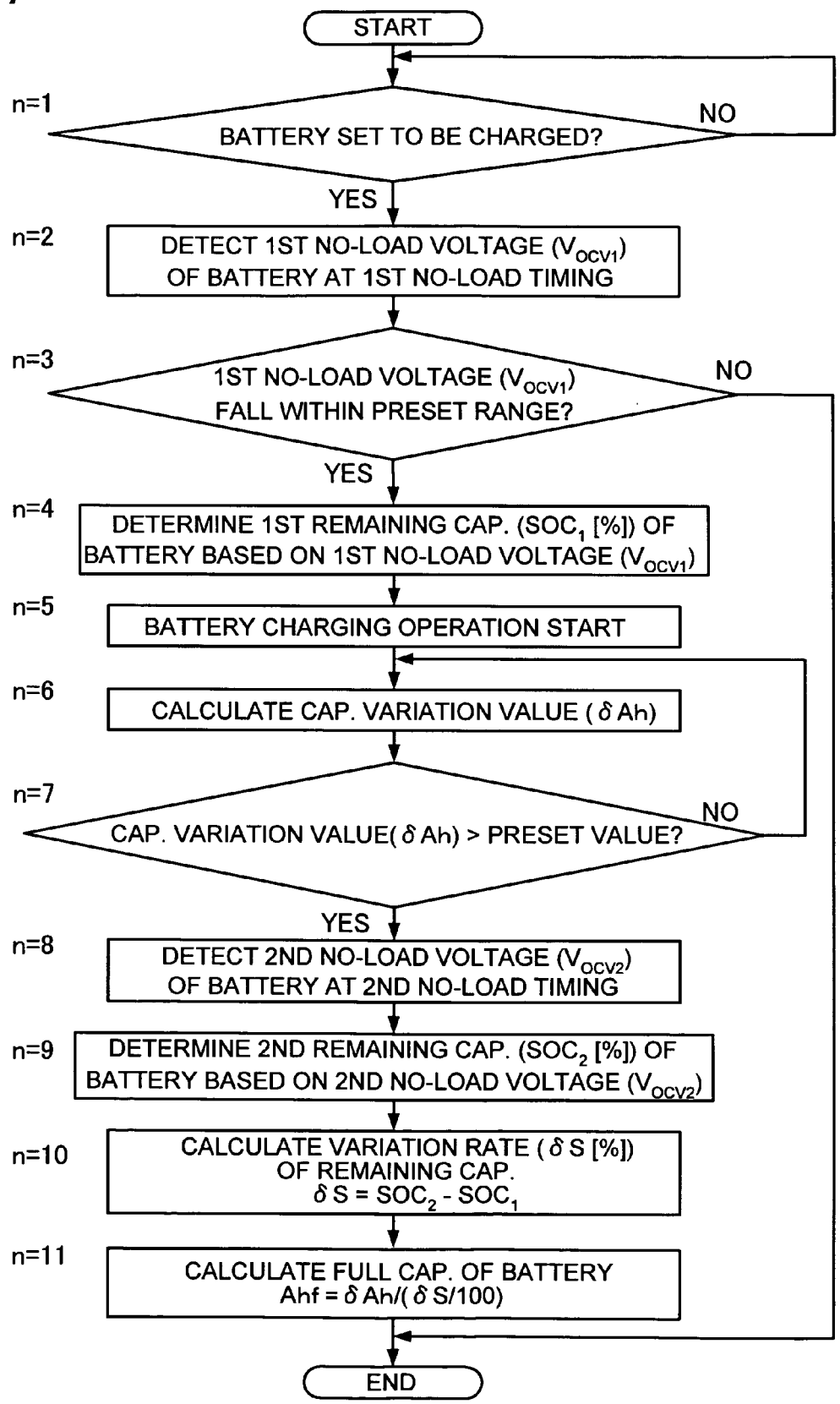
FIG. 7 is a flowchart showing a fully-charged battery capacity detection method according to still another embodiment of the present invention.

FIG. 7 is a flow chart showing a method for detecting the fully-charged capacity of the battery 1 in that the second no-load timing is timing after the capacity variation value (δAh) becomes larger than the predetermined value. In this method, the fully-charged capacity of the battery 1 is detected also before the battery is fully charged.

(Step n=1)

It is determined whether the battery 1 is set to be charged. This step is repeatedly executed until the battery 1 is set to be charged.

(Step n=2)

If the battery 1 is set to be charged, the battery 1 is brought into the no-load state before battery 1 charging operation starts. The first no-load timing is the timing in that the battery 1 is brought into the no-load state before battery 1 charging operation starts. At this first no-load timing, the first no-load voltage (VOCV1) of the battery 1 is detected.

(Steps n=3 to 5)

The remaining capacity detection portion 6 determines whether the detected first no-load voltage (VOCV1) falls within the predetermined range. If the first no-load voltage (VOCV1) falls outside the predetermined range, it is determined that the remaining capacity (SOC [%]) of the battery 1 in a charging operation initial stage falls outside the predetermined range, and the calculation of the fully-charged capacity stops. If the first no-load voltage (VOCV1) falls within the predetermined range, the first remaining capacity (SOC1 [%]) of the battery 1 is determined based on the detected first no-load voltage (VOCV1) by using the function or table. Then, battery 1 charging operation starts.

(Step n=6)

In the state where the battery 1 is charged, the capacity calculation portion 5 integrates the charging/discharging currents of the battery 1, and calculates the capacity variation value (δAh).

(Step n=7)

It is determined whether the capacity variation value (δAh) becomes larger than the predetermined value. This step is repeatedly executed until the capacity variation value (δAh) becomes larger than the predetermined value.

(Step n=8)

If the capacity variation value (δAh) becomes larger than the predetermined value, a current that flows into the battery 1 is cut off, and the battery 1 is brought into the no-load state. The second timing is the timing in that after the capacity variation value (δAh) becomes larger than the predetermined value the battery 1 is brought in the no-load state. The second no-load voltage (VOCV2) of the battery 1 is detected at this second no-load timing.

(Step n=9)

The remaining capacity detection portion 6 determines the remaining capacity (SOC2 [%]) of the battery 1 based on the detected second no-load voltage (VOCV2) by using the function or table.

In this case, it can be determined whether the detected second no-load voltage (VOCV2) falls within the predetermined voltage range, and the second remaining capacity (SOC2 [%]) of the battery can be determined based on the second no-load voltage (VOCV2) by using the function or table if the second no-load voltage (VOCV1) falls within the predetermined voltage range, and calculation of the fully-charged capacity may stop if the second no-load voltage (VOCV1) falls outside the predetermined voltage range.

(Step n=10)

The fully-charged capacity detection portion 7 calculates the remaining capacity variation rate (δS [%]) based on the difference between the first and second remaining capacities (SOC1 [%], SOC2 [%]) of the battery 1.

(Step n=11)

The fully-charged capacity detection portion 7 calculates the fully-charged capacity (Ahf) of the battery 1 based on the calculated capacity variation value (δAh) and the calculated variation rate (δS [%]) of the remaining capacity by the following formula $$Ahf = \delta Ah/(\delta S/100).$$

Additionally, in the methods shown in FIGS. 6 and 7, the remaining capacity correction circuit 8 can detect the no-load voltage (VOCV) in the state where the battery 1 is brought in the no-load state on the basis of the fully-charged capacity (Ahf) of the battery 1 that is detected by the fully-charged capacity detection portion 7, and can detect the remaining capacity (SOC [%]) based on the no-load voltage (VOCV) so that the remaining capacity correction circuit 8 can the remaining capacity (Ahr) based on the product of the detected remaining capacity (SOC [%]) and the detected fully-charged capacity (Ahf).

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2007-103,165 filed in Japan on Apr. 10, 2007, the content of which is incorporated herein by reference.

What is claimed is:

1. A fully-charged battery capacity detection method of detecting a capacity of a battery, the method comprising:
   detecting, via a voltage detection circuit, first and second no-load voltages (VOCV1, VOCV2) of the battery at a first no-load timing and a second no-load timing during which the battery is brought to a no-load state, respectively;
   determining whether the detected first no-load voltage (VOCV1) falls within a predetermined voltage range, and determining, when the first no-load voltage (VOCV1) falls within the predetermined voltage range, first and second remaining capacities (SOC1 [%], SOC2 [%]) of the battery based on the first and second no-load voltages (VOCV1, VOCV2), respectively;
   calculating a remaining capacity variation rate (δS [%]) based on a difference between the determined first and second remaining capacities (SOC1 [%], SOC2 [%]);
   calculating a capacity variation value (δAh) of the battery based on an integrated value of charging and discharging currents of the battery to be charged/discharged from the first no-load timing to the second no-load timing; and
   calculating a fully-charged capacity (Ahf) of the battery based on the remaining capacity variation rate (δS [%]) and the capacity variation value (δAh) according to the following formula:

$$Ahf = \delta Ah/(\delta S/100).$$

2. The fully-charged battery capacity detection method according to claim 1, further comprising determining whether the calculated capacity variation value (δAh) is larger than a predetermined value, and calculating, when the capacity variation value (δAh) is larger than the predetermined value, the fully-charged capacity (Ahf) of the battery based on the remaining capacity variation rate (δS [%]) and the capacity variation value (δAh).

3. The fully-charged battery capacity detection method according to claim 2, wherein the second no-load timing is based on a time when the battery is brought to the no-load state after the capacity variation value (δAh) becomes larger than 10% of a rated capacity of the battery.

4. The fully-charged battery capacity detection method according to claim 1, wherein the second no-load timing is based on a time when a predetermined period elapses after the first no-load timing.

5. The fully-charged battery capacity detection method according to claim 4, wherein the second no-load timing is based on a time when a period of a few minutes to a few hours elapses after the first no-load timing.

6. The fully-charged battery capacity detection method according to claim 5, wherein the second no-load timing is based on a time when the battery is in the no-load state when a period of five minutes to one hour elapses after an end of a battery charging operation.

7. The fully-charged battery capacity detection method according to claim 1, wherein the first no-load timing is based on a time when the battery is in the no-load state before the battery is brought in a charging operation, and the second no-load timing is based on a time when the battery is in the no-load state after an end of the charging operation.

8. The fully-charged battery capacity detection method according to claim 1,
wherein the second no-load timing is a timing before the battery is fully charged, and
wherein the method further comprises determining whether the detected second no-load voltage (VOCV2) falls within a predetermined voltage range, and determining, when the second no-load voltage (VOCV2) falls within the predetermined voltage range, the second remaining capacity (SOC2 [%]) of the battery based on the second no-load voltage (VOCV2).

9. The fully-charged battery capacity detection method according to claim 1, wherein the battery is a lithium-ion rechargeable battery.

10. The fully-charged battery capacity detection method according to claim 9, wherein the battery includes a positive electrode that contains a three-compositional material.

11. The fully-charged battery capacity detection method according to claim 1, wherein the battery is a lithium-polymer battery.

12. The fully-charged battery capacity detection method according to claim 1, wherein the first remaining capacity (SOC1 [%]) of the battery is determined based on the first no-load voltage (VOCV1) using a stored function.

13. The fully-charged battery capacity detection method according to claim 12, further comprising:
correcting, using a remaining capacity correction circuit, a remaining capacity (SOC [%]) of the battery based on the calculated fully-charged capacity (Ahf) of the battery, and detecting an accurate remaining capacity of the battery.

14. The fully-charged battery capacity detection method according to claim 1, wherein the first remaining capacity (SOC1 [%]) of the battery is determined based on the first no-load voltage (VOCV1) by referring to a stored table.

15. The fully-charged battery capacity detection method according to claim 1, wherein the second remaining capacity (SOC2 [%]) of the battery is determined based on the second no-load voltage (VOCV2) using a stored function.

16. The fully-charged battery capacity detection method according to claim 1, wherein the second remaining capacity (SOC2 [%]) of the battery is determined based on the second no-load voltage (VOCV2) by referring to a stored table.

17. The fully-charged battery capacity detection method according to claim 1, wherein a deterioration degree of the battery is determined based on the calculated fully-charged capacity (Ahf).

18. The fully-charged battery capacity detection method according to claim 1, further comprising transmitting, via a communication processing portion, information to a mobile device, the information including the calculated fully-charged capacity (Ahf).

* * * * *